(12) United States Patent
Tekletsadik et al.

(10) Patent No.: US 9,450,164 B2
(45) Date of Patent: Sep. 20, 2016

(54) HIGH VOLTAGE BUSING FOR CRYOGENICS APPLICATIONS

(71) Applicant: Varian Semiconductor Equipment Associates, Inc., Gloucester, MA (US)

(72) Inventors: Kasegn D. Tekletsadik, Middleton, MA (US); Charles Stanley, Amesbury, MA (US); Semaan Fersan, Hamilton, MA (US); Nicholas A. Venuto, Billerica, MA (US); Scott Nickerson, Plaistow, NH (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 7 days.

(21) Appl. No.: 13/799,070

(22) Filed: Mar. 13, 2013

(65) Prior Publication Data
US 2014/0262492 A1    Sep. 18, 2014

(51) Int. Cl.
| | |
|---|---|
| H02G 3/18 | (2006.01) |
| H01L 39/16 | (2006.01) |
| H01B 17/56 | (2006.01) |
| H01B 17/58 | (2006.01) |
| H02G 15/34 | (2006.01) |
| H01B 17/20 | (2006.01) |
| H01B 17/26 | (2006.01) |
| H01B 17/28 | (2006.01) |
| H01B 17/12 | (2006.01) |

(52) U.S. Cl.
CPC ............. *H01L 39/16* (2013.01); *H01B 17/56* (2013.01); *H01B 17/58* (2013.01); *H01B 17/583* (2013.01); *H02G 15/34* (2013.01)

(58) Field of Classification Search
CPC ..... H01B 17/583; H01B 17/58; H01B 17/56
USPC ..... 174/650, 140 R, 142, 143, 140 S, 152 R, 174/167
See application file for complete search history.

(56) References Cited

U.S. PATENT DOCUMENTS

| | | | |
|---|---|---|---|
| 3,962,667 A * | 6/1976 | Link | 337/202 |
| 6,333,462 B1 | 12/2001 | Quaggia | |
| 2003/0154727 A1* | 8/2003 | Ashibe et al. | 62/45.1 |
| 2008/0119362 A1 | 5/2008 | Ashibe et al. | |
| 2009/0166084 A1 | 7/2009 | Mirebeau et al. | |
| 2011/0308078 A1 | 12/2011 | Murphy | |

FOREIGN PATENT DOCUMENTS

| | | |
|---|---|---|
| KR | 2010-0010654 A1 | 10/2010 |
| KR | 101034327 B1 | 5/2011 |

OTHER PUBLICATIONS

International Search Report and Written Opinion mailed May 29, 2014 for PCT Application, PCT/.US2014/023979 filed Mar. 12, 2014.

* cited by examiner

*Primary Examiner* — Hoa C Nguyen
*Assistant Examiner* — Binh Tran

(57) ABSTRACT

An electrical bushing is disclosed for use in high voltage cryogenic applications. The bushing including first and second bushing portions and an electrical conductor disposed longitudinally within the portions. The electrical conductor has a first terminal extending from the first bushing portion and a second terminal extending from the second bushing portion. The first terminal is configured to couple to a first electrical element at ambient temperature, and the second terminal is configured to couple to a second electrical element at cryogenic temperature. The first and second bushing portions comprise a base insulator material, while the first bushing portion further comprises an environmental protection layer disposed over the base insulator portion.

18 Claims, 4 Drawing Sheets

HIGH VOLTAGE BUSING FOR CRYOGENICS APPLICATIONS

BACKGROUND OF THE INVENTION

1. Field of the Invention

Embodiments of the invention relate to high-voltage bushings in general, and in particular to high-voltage bushings for use in cryogenics applications involving superconducting devices.

2. Discussion of Related Art

Superconducting Fault Current Limiters (SCFCL) are a class of devices that operate at a cryogenic temperature and are often used in electrical transmission or distribution lines that are subjected to high voltages and high currents. SCFCLs are often used to provide protection against current surges, for example in power transmission networks.

Because SCFLs operate at cryogenic temperatures, large temperature differences are often experienced between the superconductive elements of the SCFL and the external equipment connected thereto. For example, cryogenic temperatures may be about −200 C, while the external equipment typically resides at ambient temperature. As such, a connection structure must be provided between the superconductive elements and the external equipment to accommodate the temperature transition, while also minimizing thermal losses.

Conventional high voltage bushings can fail when used at cryogenics temperature. The main failure mechanism is thermal stress due to the large temperature variations between ambient and cryogenic temperatures. Having a reliable high voltage bushing is important to the success of superconducting devices including SCFLs, transformers, generators, motors, energy storage devices and others. Thus, there is a need for an improved high voltage bushing for use in cryogenic applications.

SUMMARY OF THE INVENTION

This Summary is provided to introduce a selection of concepts in a simplified form that are further described below in the Description of Embodiments. This Summary is not intended to identify key features or essential features of the claimed subject matter, nor is it intended as an aid in determining the scope of the claimed subject matter.

An electrical bushing is disclosed. The bushing may include a first bushing portion and a second bushing portion, and an electrical conductor disposed longitudinally within the first and second bushing portions. The electrical conductor may have a first terminal extending from the first bushing portion and a second terminal extending from the second bushing portion. The first terminal may be for coupling to a first electrical element at ambient temperature, while the second terminal may be for coupling to a second electrical element at cryogenic temperature. The first and second bushing portions may comprise a base insulator material. The first bushing portion may further comprise an environmental protection layer disposed over the base insulator portion.

An electrical bushing is disclosed, comprising first and second bushing portions, and an electrical conductor disposed within the first and second bushing portions. The electrical conductor may have a first terminal extending from the first bushing portion for coupling to an electrical element at ambient temperature. The electrical conductor may have a second terminal extending from the second bushing portion for coupling to a superconducting element at cryogenic temperature. The first and second bushing portions may comprise a base insulator, while the first bushing portion may further comprises an environmental protection layer disposed only over the base insulator.

An electrical bushing is disclosed, comprising first and second bushing portions and an electrical conductor disposed therein. The electrical conductor may include a first terminal adjacent to the first bushing portion for coupling to a first electrical element and a second terminal extending from the second bushing portion for coupling to a second electrical element. The first electrical element may be at ambient temperature while the second electrical element may be a Superconducting Fault Current Limiter at cryogenic temperature. The first and second bushing portions may comprise a unitary base insulator, while the first bushing portion further comprises an environmental protection layer disposed only over the base insulator.

BRIEF DESCRIPTION OF THE DRAWINGS

The accompanying drawings illustrate preferred embodiments of the disclosed method so far devised for the practical application of the principles thereof, and in which.

DESCRIPTION OF EMBODIMENTS

Figure 1:
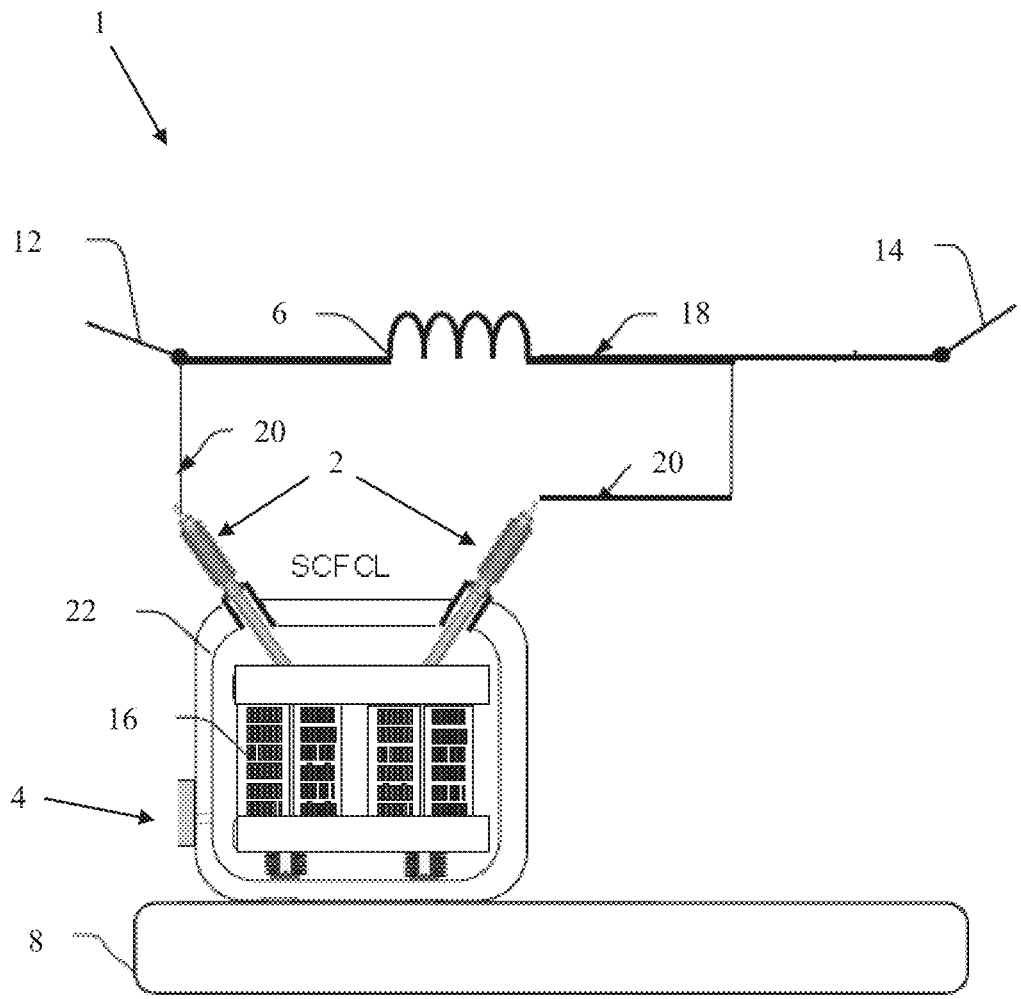
FIG. 1 is an exemplary current limiting system incorporating an embodiment of the disclosed bushing.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To address some of the deficiencies in the aforementioned bushings, a high voltage bushing is disclosed in which one end works in a cryogenic environment and the other end works in an ambient environment. This bushing can accommodate the thermal stresses caused by the large differential between ambient and cryogenic temperatures. The bushing can also operate reliably at ambient or outdoor applications and withstand environmental stresses including weather variations, rain, snow, sand and other natural and man-made environmental hazards.

Referring now to FIG. 1, a general architecture of an exemplary SCFCL system 1 is shown which employs an embodiment of the disclosed bushing 2. Although the bushing 2 will be described in relation to its application with an exemplary SCFCL, it will be appreciated that its use is not so limited. Rather, the disclosed bushing 2 will find application in any of a variety of applications in which high temperature differentials are experienced between current carrying components.

The illustrated SCFCL system 1 includes an SCFCL 4, a shunt reactor 6, which may be a conventional shunt reactor and an insulation system 8. In operation, the SCFCL system 1 provides fault current protection by limiting load current that passes between an entry point 12 and an exit point 14. Under normal operation mode a load current may periodically, occasionally, or continuously pass through the SCFCL system 1. The load current in normal operation mode exhibits a current level such that the superconductor elements 16 remain in a superconducting state and therefore transmit the load current through superconductor elements with zero resistance when the load current passes through the SCFCL 4. During a fault condition in which an excessive load current may be rapidly generated, the superconductor elements 16 react to the excessive load current by transforming from a superconducting state to a finite resistivity state, which places a large overall impedance to the excessive load current, thereby limiting the load current during the fault condition. Subsequently, the superconductor elements 16 may return to a superconducting state to regulate current load by limiting current in future fault events.

As can be seen, the SCFCL system 1 forms two parallel electrical paths 18, 20, which branch between entry point 12 and exit point 14. Accordingly, the SCFCL 4 and shunt reactor 6 are arranged in an electrically parallel fashion in the SCFCL system 1 along the respective electrical paths 18 and 20. Under normal operation mode the SCFCL system is configured to draw approximately one hundred percent of load current through the SCFCL 4 and approximately zero percent of load current through the shunt reactor 6. However, when a fault condition or event occurs, the shunt reactor 6 is configured to draw a majority of the load current, thereby limiting the current passing through the SCFCL 4.

Figure 2:
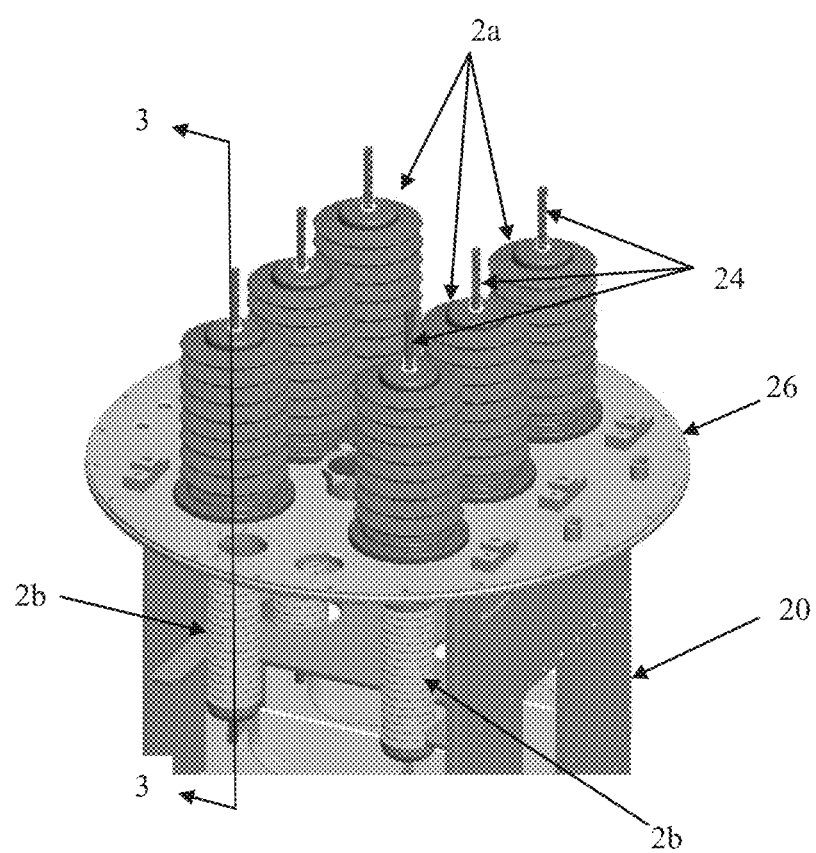
FIG. 2 is an isometric cutaway view of a portion of an exemplary superconducting fault current limiter employing a plurality of the disclosed bushings.

Owing to the fact that the superconducting elements 16 of the SCFCL are typically submerged in a cryogenic medium, at least a portion of the bushing 2 adjacent the superconducting elements will be subject to temperatures that are lower (by about 200 C) than the external electrical equipment to which the SCFL is attached. FIG. 2 illustrates a portion of the SCFCL of FIG. 1 including a plurality of bushings 2 having a first bushing portion 2a disposed outside of a cryostat enclosure 22 and a second bushing portion 2b disposed inside the cryostat enclosure 22.

In one embodiment, the cryostat enclosure 22 is temperature and pressure controlled, particularly, cryogenically cooled to sustain temperatures appropriate for the superconducting elements 16. As will be appreciated, this temperature can be maintained by liquid nitrogen or other appropriate liquid cryogen. Generally, the bushings 2 are electrically coupled to outside power generation, transmission and distribution devices, while inside the cryostat enclosure 22 the bushings 2 electrically couple the superconducting elements 16. Each of the bushings 2 can enclose a conductor 24 for coupling the superconducting elements 16 of the SCFCL (at cryogenic temperature) to external equipment (at ambient temperature), such as that described in relation to FIG. 1. The conductor 24 may be copper, aluminum, or other appropriate material. The cryostat enclosure 22 includes a top flange 26 that separates the internal cryogenic portion of the enclosure from the external ambient environment so that, during operation, the first bushing portions 2a are exposed to ambient temperature while the second bushing portions 2b are subject to cryogenic temperature. This bushing 2 should be configured to accommodate the aforementioned temperature transition while ensuring that losses by thermal conduction are small, so as to avoid boiling the cryogenic liquid that cools the superconducting elements 16 and/or so as to avoid increasing the cost of cooling the elements.

Figure 3:
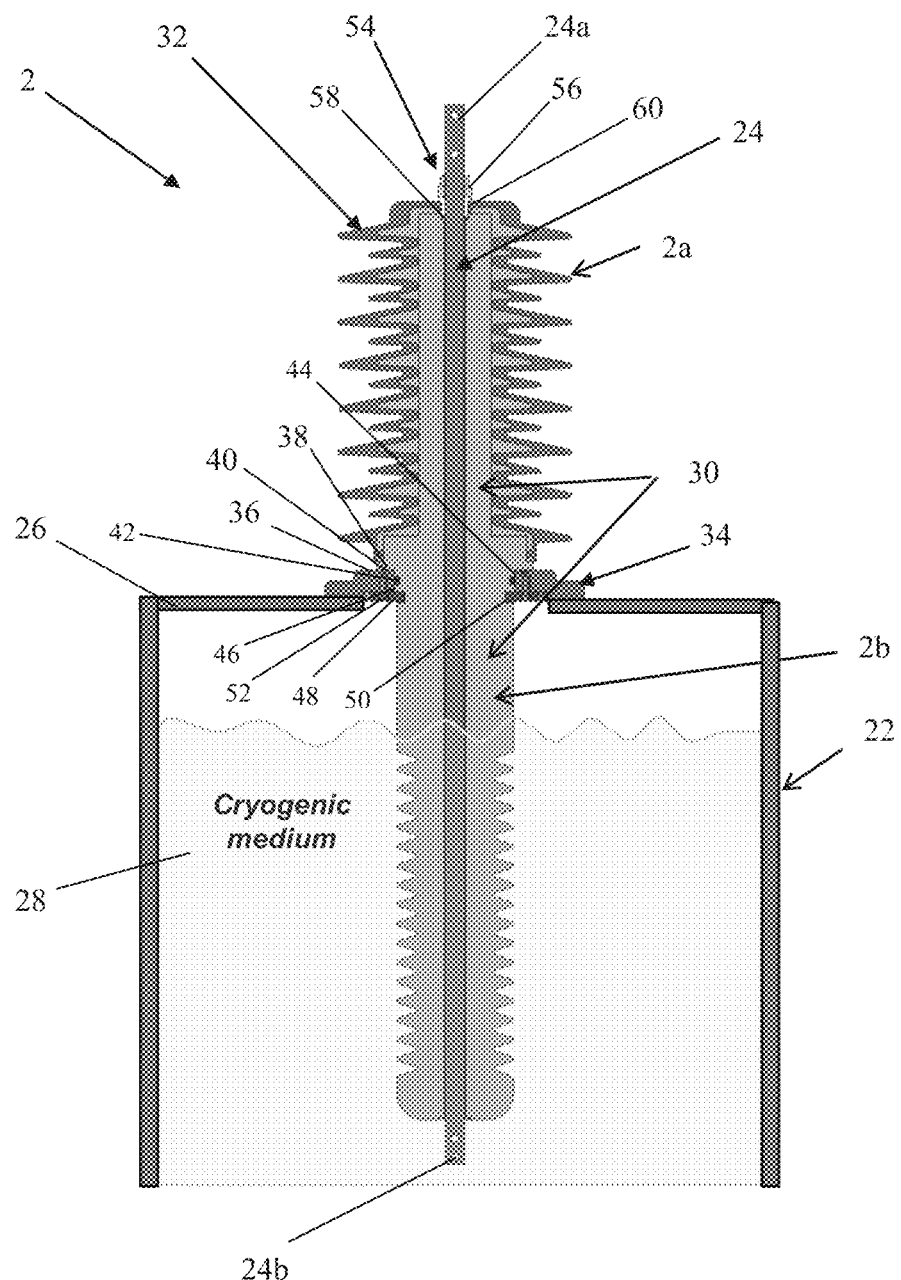
FIG. 3 is a cross-section of the exemplary superconducting fault current limiter of FIG. 2 taken along line 3-3 of FIG. 2.

FIG. 3 shows the internal configuration of one of the bushings 2 of FIG. 2 in the context of a cryostat enclosure 22 that contains a cryogenic medium 28, such as liquid nitrogen. As noted, the first portion 2a of the bushing 2 is exposed to the ambient (i.e., outside) environment, while the second portion 2b of the bushing is at least partially submerged in the cryogenic medium. The bushing 2 encloses the conductor 24 which runs through the entire length of the bushing to couple the superconducting elements 16 of the SCFCL to external equipment, as previously discussed.

As can be seen, the bushing 2 includes a base insulator portion 30 that is compatible with the cryogenic medium 28 that fills the cryostat enclosure 22. In one embodiment the base insulator portion 30 can be a cryogenic ceramic material. A non-limiting exemplary listing of other appropriate materials for base insulator portion 30 includes fiberglass, Teflon, Delrin or any other dielectric material compatible with cryogenics temperatures and media. The first portion 2a of the bushing 2 may be provided with an environmental protection covering 32. This environmental protection covering 32 can protect the bushing 2 from the effects of harsh outdoor environments, including rain, snow, sun and the like. In one embodiment, the environmental protection covering 32 comprises a silicon rubber compound. A non-limiting exemplary listing of other appropriate materials for environmental protection covering 32 includes porcelain, glass, rubber, or any other material typically used for bushings. The second portion 2b of the bushing does not include an environmental protection covering 32, such that the base insulator portion 30 is directly exposed to the cryogenic medium 28 within the cryostat.

The bushing 2 is coupled at or near its midpoint to the top flange 26 of the cryostat enclosure 22 so that the first portion 2a is disposed outside the enclosure and the second portion 2b is disposed inside the enclosure. The bushing 2 is coupled to the top flange in a leak tight manner by a sealing flange 34 which is welded or otherwise fixed to the top flange 26. The sealing flange 34 has a top surface 36 upon which rests a lower shoulder portion 38 of the bushing 2. A first seal 40 may be disposed between the top surface 36 and the shoulder portion 38 to seal the two surfaces. A second seal 42 may be disposed between an inner circumferential surface 44 of the sealing flange 34 and an opposing outer surface 46 of the bushing. The first and second seals 40, 42 may be O-rings or gaskets disposed in suitable recesses formed in the sealing flange 34 and/or the bushing 2. One or more locking plates 48 may be disposed within corresponding radial grooves 50 in the bushing 2. The locking plates 48 may be fixed to the sealing flange 34 via fasteners 52 such as socket head cap screws. Thus arranged, the sealing flange 34 is sandwiched between the shoulder portion 38 of the bushing and the locking plates 48, fixing and sealing the bushing to the top flange 26 of the cryostat enclosure 22.

As previously noted, the conductor 24 couples the superconducting elements 16 of the SCFCL to external equipment as described in relation to FIG. 1. Thus, the conductor 24 may have a first terminal 24a extending from the first portion 2a of the bushing and a second terminal 24b extending from the second portion 2b of the bushing. In the illustrated embodiment, the second terminal 24b is disposed within the cryostat 22 and couples to the superconducting elements 16 of the SCFCL. A portion of the conductor 24 adjacent to the first terminal 24a may be fixed and sealed to the first portion 2a of the bushing 2. In one embodiment, a gland seal 54 may fix and seal the first portion 2a of the bushing to the conductor 24. The gland seal 54 may include a gland nut 56 and a seal 58, such as a gasket or an O-ring. The gland nut 56 may be threadably received in an end recess 60 of the bushing 2 so that when the gland nut 56 is tightened, the seal 58 fixes and seals the conductor to the bushing. This arrangement also allows for differential expansion and contraction of the conductor and bushing to minimize stress imparted to the system components.

Figure 4:
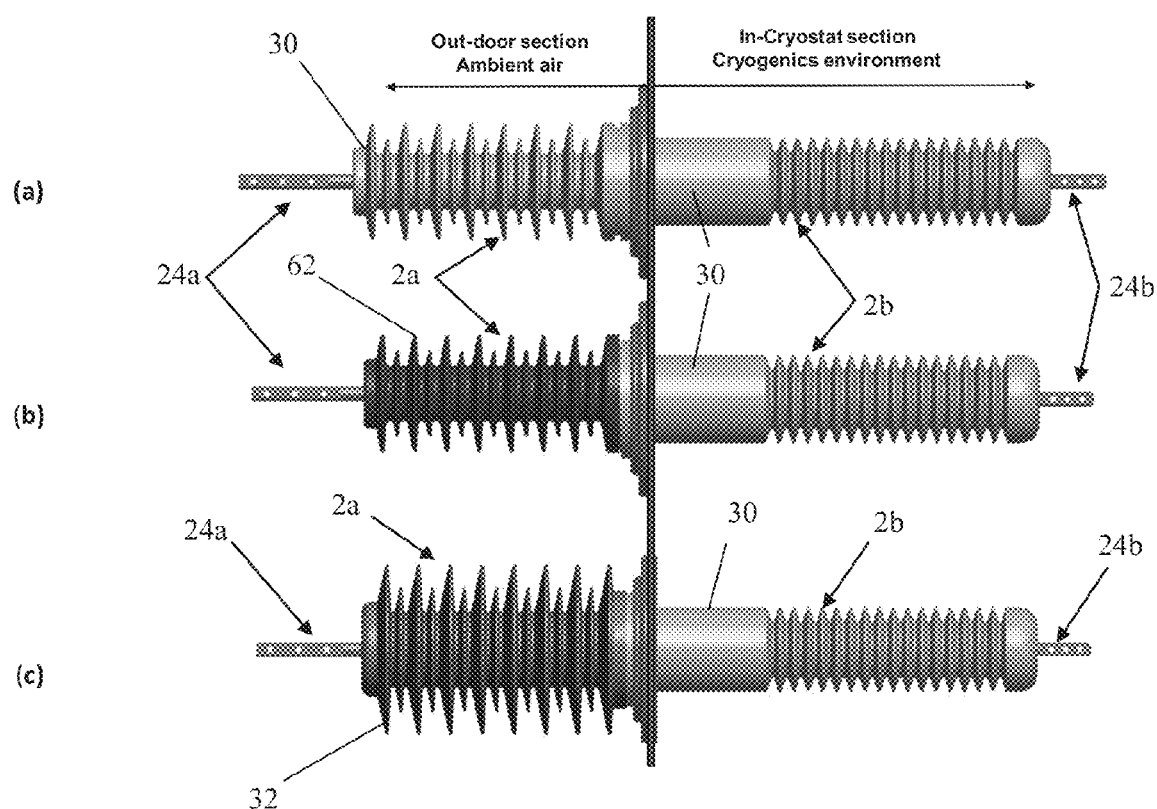
FIGS. 4A-4C illustrate a series of steps in manufacturing an embodiment of the disclosed bushing.

FIGS. 4A-4C show the manufacturing steps for creating the disclosed bushing 2. Initially, a base insulator material 30 is fabricated by molding, machining or other appropriate technique (FIG. 4A). As previously noted, the base insulator material 30 may be a cryogenic ceramic material that is compatible with cryogenic fluids and that can withstand cryogenic temperatures. The first and second portions 2a, 2b may be formed as a unitary piece. Alternatively, the first and second portions may be made from separate pieces and joined together. The first portion 2a of the bushing (i.e., the portion that will be exposed to ambient (outdoor) environment) may then be subjected to a chemical surface preparation to roughen the outer surface 62 (FIG. 4B). An environmental protection covering 32 may then be applied to the prepared surface of the first portion 2a. In one embodiment, the environmental protection covering is a silicon rubber material that may be cast, molded or otherwise applied to the etched outer surface 62 of the first portion 2a of the bushing 2. In one embodiment, where the bushing 2 is configured for operating at about 45 KV, the finished first portion 2a may have an outer diameter of about 8 inches, while the finished second portion 2b may have an outer diameter of about 6 inches. It will be appreciated, however, that the finished dimensions, proportions, and materials will depend upon the particular service of the bushing.

While the present invention has been disclosed with reference to certain embodiments, numerous modifications, alterations and changes to the described embodiments are possible without departing from the spirit and scope of the invention, as defined in the appended claims. Accordingly, it is intended that the present invention not be limited to the described embodiments, but that it has the full scope defined by the language of the following claims, and equivalents thereof.

What is claimed is:

1. An electrical bushing, comprising:
a first bushing portion and a second bushing portion;
an electrical conductor disposed longitudinally within the first and second bushing portions, the electrical conductor having a first terminal extending from the first bushing portion and a second terminal extending from the second bushing portion, the first terminal for coupling to a first electrical element at ambient temperature, the second terminal for coupling to a second electrical element at cryogenic temperature;
wherein the first and second bushing portions comprise a base insulator material, and
wherein the first bushing portion further comprises an environmental protection layer disposed over and in direct contact with the base insulator material;
a sealing flange for coupling the bushing to the cryostat enclosure, the sealing flange having a top surface for engaging a lower shoulder portion of the bushing; and
a locking plate disposed within a radial groove in the bushing, the locking plate fixable to the sealing flange via a fastener, wherein the sealing flange is sandwiched between the shoulder portion of the bushing and the locking plate to fix the bushing to the sealing flange.

2. The bushing of claim 1, further comprising a gland seal disposed at a distal end of the first bushing portion, the gland seal configured to fix the electrical conductor to the first bushing portion.

3. The bushing of claim 1, the sealing flange including a first seal disposed between the top surface and the lower shoulder portion, and a second seal disposed between an inner circumferential surface of the sealing flange and an opposing outer surface of the bushing.

4. The bushing of claim 3, wherein the first and second seals are disposed in corresponding recesses in at least one of the sealing flange and the bushing.

5. The bushing of claim 4, wherein the first and second seals comprise o-rings.

6. The bushing of claim 1, wherein the first and second bushing portions comprise a unitary piece.

7. The bushing of claim 1, wherein the first electrical element comprises a superconducting element.

8. The bushing of claim 1, wherein the environmental protection layer comprises one of a silicon rubber compound, and rubber.

9. The bushing of claim 1, wherein the base insulator material of the first bushing portion has a surface roughness greater than a surface roughness of the base insulator material of the second bushing portion, and wherein the environmental protection layer is disposed over and in direct contact with the base insulator material of the first bushing portion.

10. An electrical bushing, comprising:
first and second bushing portions;
an electrical conductor disposed within the first and second bushing portions, the electrical conductor having a first terminal extending from the first bushing portion for coupling to an electrical element at ambient temperature, the electrical conductor having a second terminal extending from the second bushing portion for coupling to a superconducting element at cryogenic temperature;
wherein the first and second bushing portions comprise a base insulator, and the first bushing portion further comprises an environmental protection layer disposed only over and in direct contact with the base insulator;
a sealing flange for coupling the bushing to the cryostat enclosure, the sealing flange having a top surface for engaging a lower shoulder portion of the bushing; and
a locking plate disposed within a radial groove in the bushing, the locking plate fixable to the sealing flange via a fastener, wherein the sealing flange is sandwiched between the shoulder portion of the bushing and the locking plate to fix the bushing to the sealing flange.

11. The bushing of claim 10, further comprising a gland seal engaged with the first bushing portion, the gland seal for fixing the electrical conductor to the first bushing portion.

12. The bushing of claim 10, further comprising a first seal disposed between the top surface of the sealing flange and the lower shoulder portion of the bushing, and a second seal disposed between an inner circumferential surface of the sealing flange and an opposing outer surface of the bushing.

13. The bushing of claim 12, wherein the first and second seals are disposed in corresponding recesses in at least one of the sealing flange and the bushing.

14. The bushing of claim 10, wherein the first and second bushing portions comprise separate pieces of said base insulator.

15. The bushing of claim 10, wherein the first and second bushing portions comprise a unitary piece of said base insulator.

16. An electrical bushing, comprising:
first and second bushing portions and an electrical conductor disposed therein;
wherein the electrical conductor includes a first terminal adjacent to the first bushing portion for coupling to a first electrical element and a second terminal extending from the second bushing portion for coupling to a second electrical element;
wherein the first electrical element is at ambient temperature and the second electrical element is a Superconducting Fault Current Limiter at cryogenic temperature; and
wherein the first and second bushing portions comprise a unitary base insulator, and the first bushing portion further comprises an environmental protection layer disposed only over and in direct contact with the base insulator;
a sealing flange for coupling the bushing to the cryostat enclosure, the sealing flange having a top surface for engaging a lower shoulder portion of the bushing; and
a locking plate disposed within a radial groove in the bushing, the locking plate fixable to the sealing flange via a fastener, wherein the sealing flange is sandwiched between the shoulder portion of the bushing and the locking plate to fix the bushing to the sealing flange.

17. The bushing of claim 16, further comprising a gland seal engaged with the first bushing portion, the gland seal for fixing the electrical conductor to the first bushing portion.

18. The bushing of claim 16, further comprising a first seal disposed between the top surface of the sealing flange and the lower shoulder portion of the bushing, and a second seal disposed between an inner circumferential surface of the sealing flange and an opposing outer surface of the bushing.

* * * * *